US012220840B2

(12) United States Patent
Kakinuma (10) Patent No.: US 12,220,840 B2
(45) Date of Patent: Feb. 11, 2025

(54) SHEET STICKING APPARATUS

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 330 days.

(21) Appl. No.: 17/814,609

(22) Filed: Jul. 25, 2022

(65) Prior Publication Data
US 2023/0048636 A1 Feb. 16, 2023

(30) Foreign Application Priority Data
Aug. 11, 2021 (JP) ................................. 2021-131408

(51) Int. Cl.
*B28D 7/02* (2006.01)
*B28D 1/22* (2006.01)
*B28D 7/04* (2006.01)

(52) U.S. Cl.
CPC .................. *B28D 7/02* (2013.01); *B28D 1/22* (2013.01); *B28D 7/04* (2013.01)

(58) Field of Classification Search
CPC ............... B28D 7/02; B28D 7/04; B28D 1/22
USPC ............................................................ 83/78
See application file for complete search history.

(56) References Cited

U.S. PATENT DOCUMENTS

| | | | | |
|---|---|---|---|---|
| 4,923,251 A * | 5/1990 | Funakawa | .................. | B24B 7/22 451/354 |
| 6,182,546 B1 * | 2/2001 | Hecker | ............. | H01L 21/67092 83/365 |
| 6,671,940 B2 * | 1/2004 | Ishii | .................. | B28D 1/121 29/33 M |
| 2009/0133549 A1 * | 5/2009 | Ishii | .................. | H01L 21/67132 83/675 |
| 2009/0272403 A1 * | 11/2009 | Yamamoto | ............. | B26D 7/088 156/523 |
| 2013/0119106 A1 * | 5/2013 | Moyal | .................... | B26D 5/007 225/2 |
| 2015/0338316 A1 * | 11/2015 | Chen | .................... | G01N 1/286 83/111 |

FOREIGN PATENT DOCUMENTS

| | | |
|---|---|---|
| JP | 2006005131 A | 1/2006 |
| JP | 2009-269112 A | 11/2009 |

OTHER PUBLICATIONS

Office Action issued by the Japanese Patent Office for corresponding Patent Application No. 2021-131408, dated Oct. 23, 2024.

\* cited by examiner

*Primary Examiner* — Omar Flores Sanchez
(74) *Attorney, Agent, or Firm* — GREER BURNS & CRAIN, LTD.

(57) ABSTRACT

A sheet sticking apparatus includes a sticking unit that sticks a sheet to a workpiece held by a chuck table and a cutting unit that cuts the stuck sheet. The cutting unit includes a cutting blade that cuts the sheet, a movement unit that raises and lowers the cutting blade from and toward the chuck table or moves the cutting blade along the outer circumference of the workpiece, and a cleaning part that removes adhering things of the cutting blade. The cleaning part is disposed on the trajectory of the cutting blade that moves by the movement unit and executes cleaning by coming into contact with the cutting blade that moves.

10 Claims, 7 Drawing Sheets

SHEET STICKING APPARATUS

BACKGROUND OF THE INVENTION

Field of the Invention

The present invention relates to a sheet sticking apparatus.

Description of the Related Art

Various device chips are manufactured from various plate-shaped workpieces such as a semiconductor wafer, a resin package substrate, a glass substrate, and a ceramic substrate in which semiconductor devices are formed, and such device chips are used for electronic equipment. Each substrate is ground to be thinned and is processed by a cutting blade or a laser beam to be divided. At this time, a resin sheet such as an adhesive tape is stuck to the workpiece by a sheet sticking apparatus for the purposes of protecting the front surface (device surface) of the wafer and preventing chips from becoming dispersed (for example, refer to Japanese Patent No. 4387879).

SUMMARY OF THE INVENTION

In the sheet sticking apparatus, after the sheet having a wider width than the workpiece is stuck to the workpiece, an unnecessary sheet at the outer circumferential portion is cut and removed by a cutting blade such as a cutter blade. The cutting blade involves such a problem that, when dust of a sheet made of soft resin adheres to the cutting blade, the sharpness thereof lowers and cutting failure such as a phenomenon in which the sheet is not completely cut or the cut end part becomes ragged occurs.

Accordingly, an object of the present invention is to provide a sheet sticking apparatus that can easily reduce the possibility of occurrence of cutting failure.

In accordance with an aspect of the present invention, there is provided a sheet sticking apparatus including a sticking unit that sticks a sheet to a workpiece held by a chuck table and a cutting unit that cuts the stuck sheet. The cutting unit includes a cutting blade that cuts the sheet, a movement unit that raises and lowers the cutting blade from and toward the chuck table or moves the cutting blade along the outer circumference of the workpiece, and a cleaning part that removes adhering things of the cutting blade. The cleaning part is disposed on the trajectory of the cutting blade that moves by the movement unit and executes cleaning by coming into contact with the cutting blade that moves.

Preferably, the cleaning part brings a scraper or a brush into contact with the cutting blade. The present invention can easily reduce the possibility of occurrence of cutting failure.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not limited by contents described in the following embodiments. Moreover, what can easily be envisaged by those skilled in the art and what are substantially the same are included in constituent elements described below. In addition, configurations described below can be combined as appropriate. Further, various kinds of omission, replacement, or change of a configuration can be carried out without departing from the gist of the present invention.

First Embodiment

Figure 1:
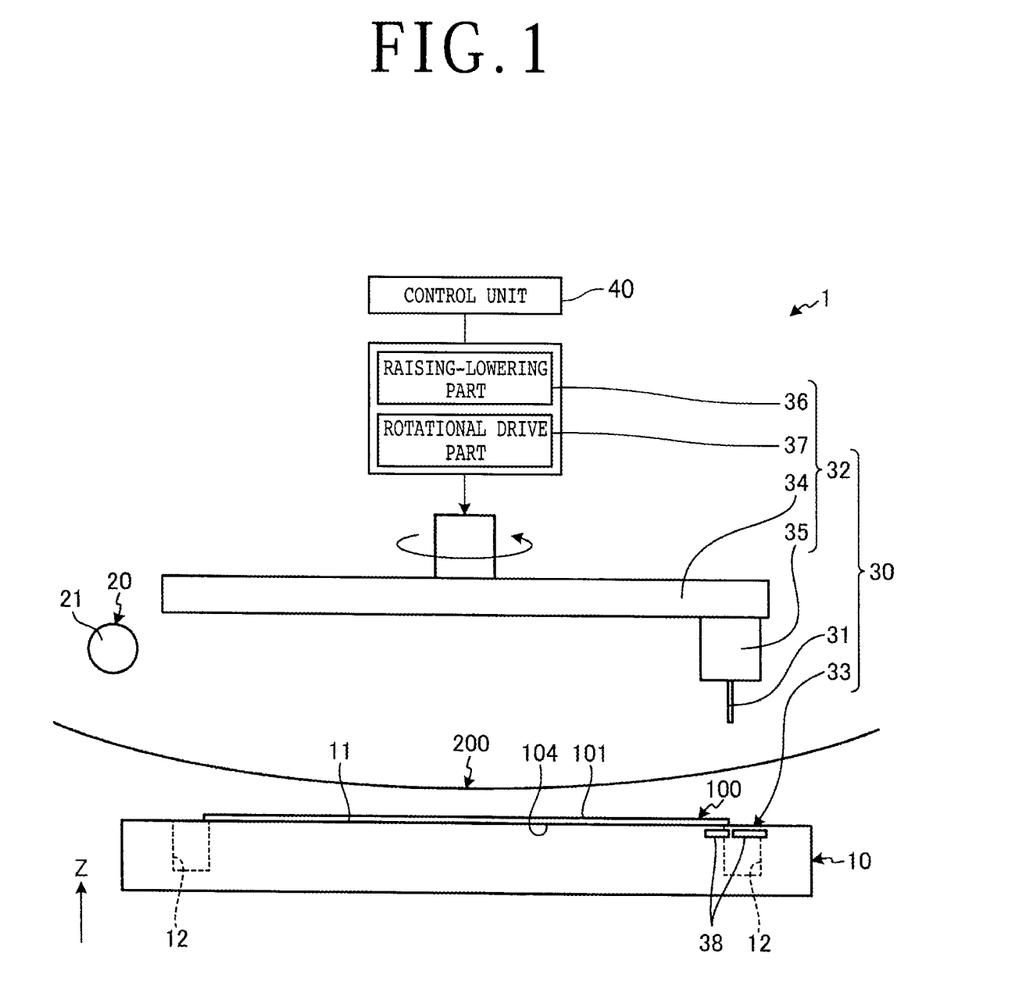
FIG. 1 is a sectional view illustrating a configuration example of a sheet sticking apparatus according to a first embodiment of the present invention.
Figure 2:
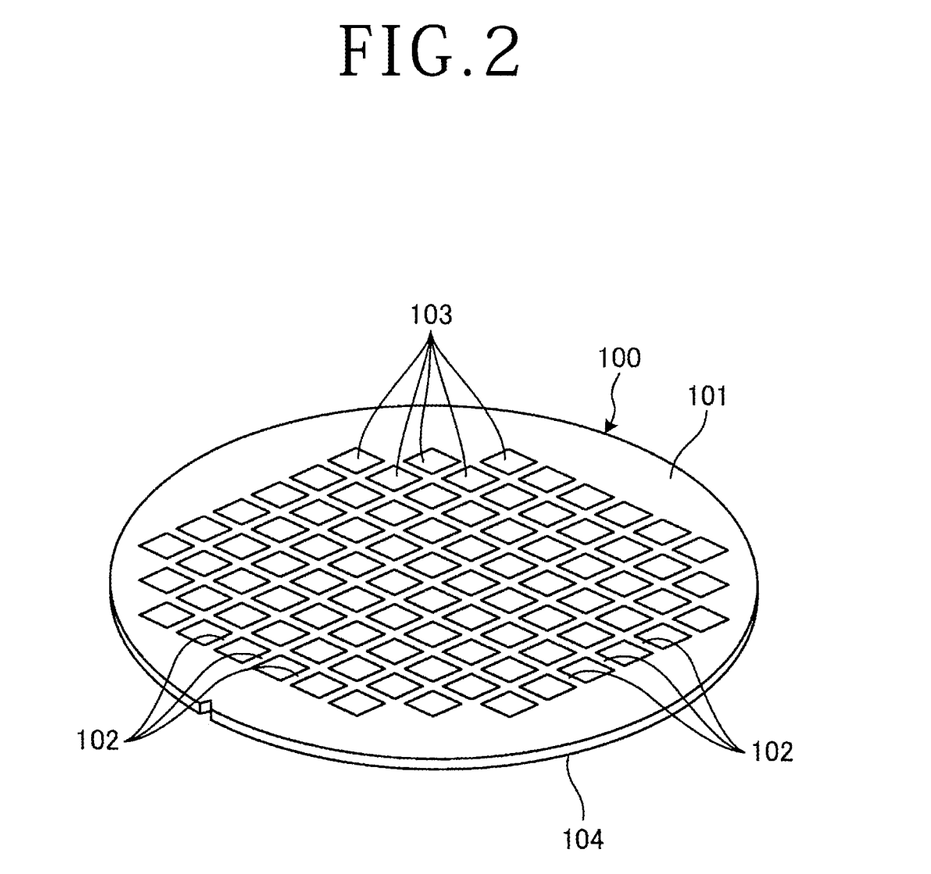
FIG. 2 is a plan view illustrating a workpiece that is a sheet sticking target of the sheet sticking apparatus depicted in FIG. 1.
Figure 3:
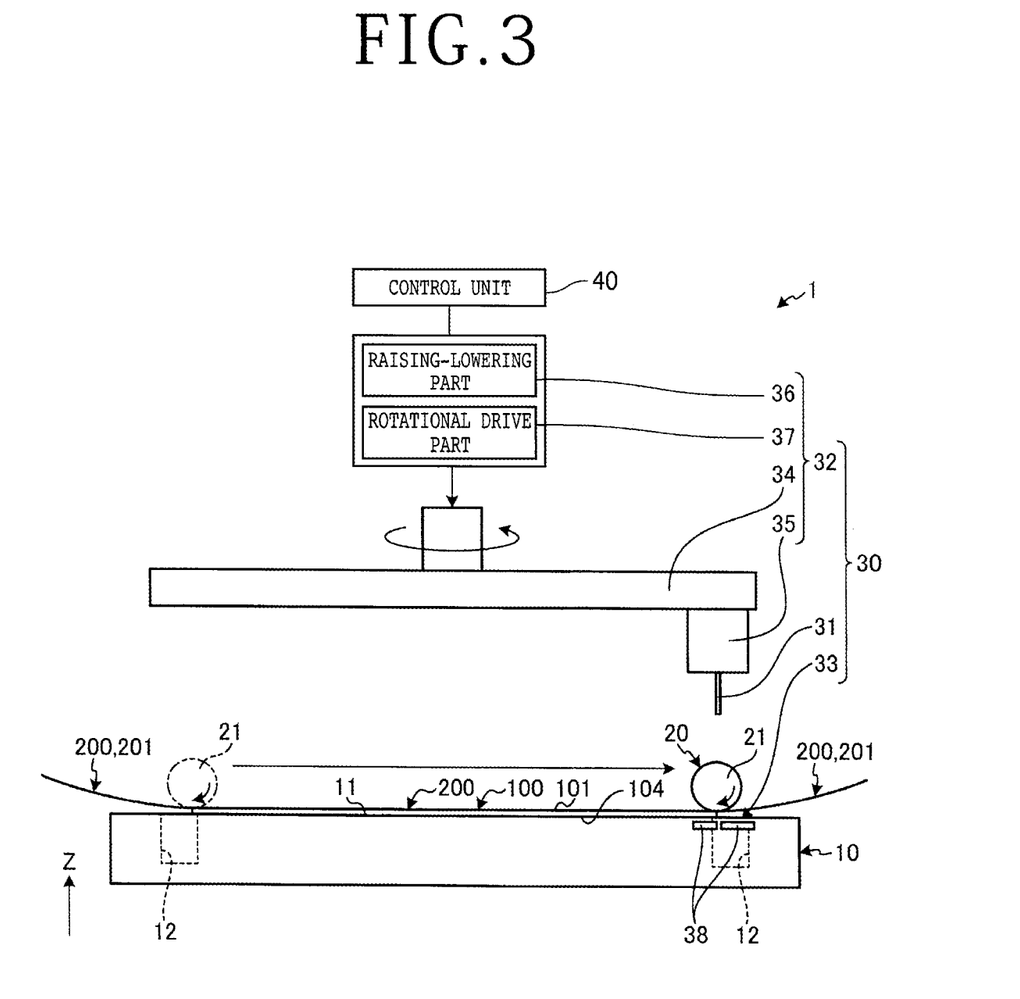
FIG. 3 is a sectional view illustrating a sticking unit depicted in FIG. 1.
Figure 4:
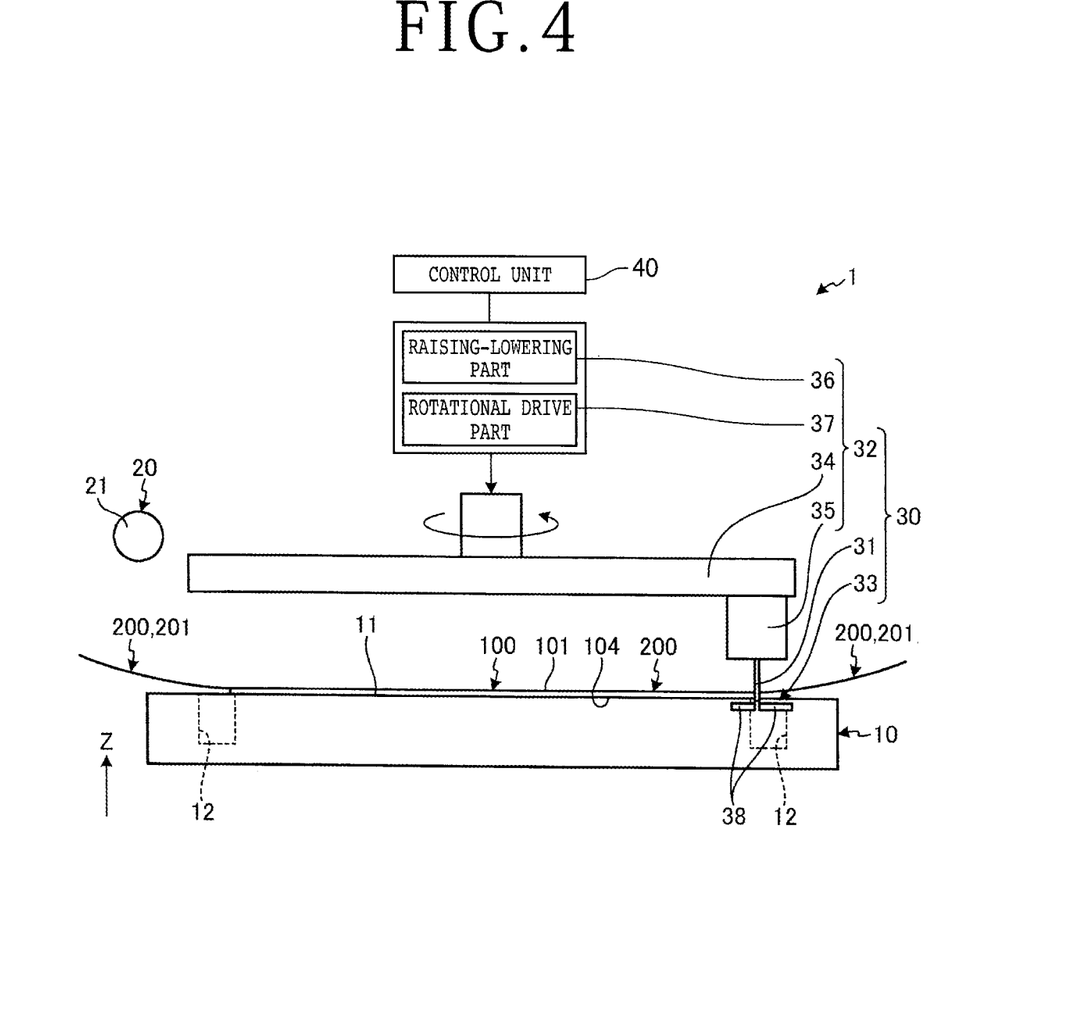
FIG. 4 is a sectional view illustrating a cutting unit depicted in FIG. 1.
Figure 5:
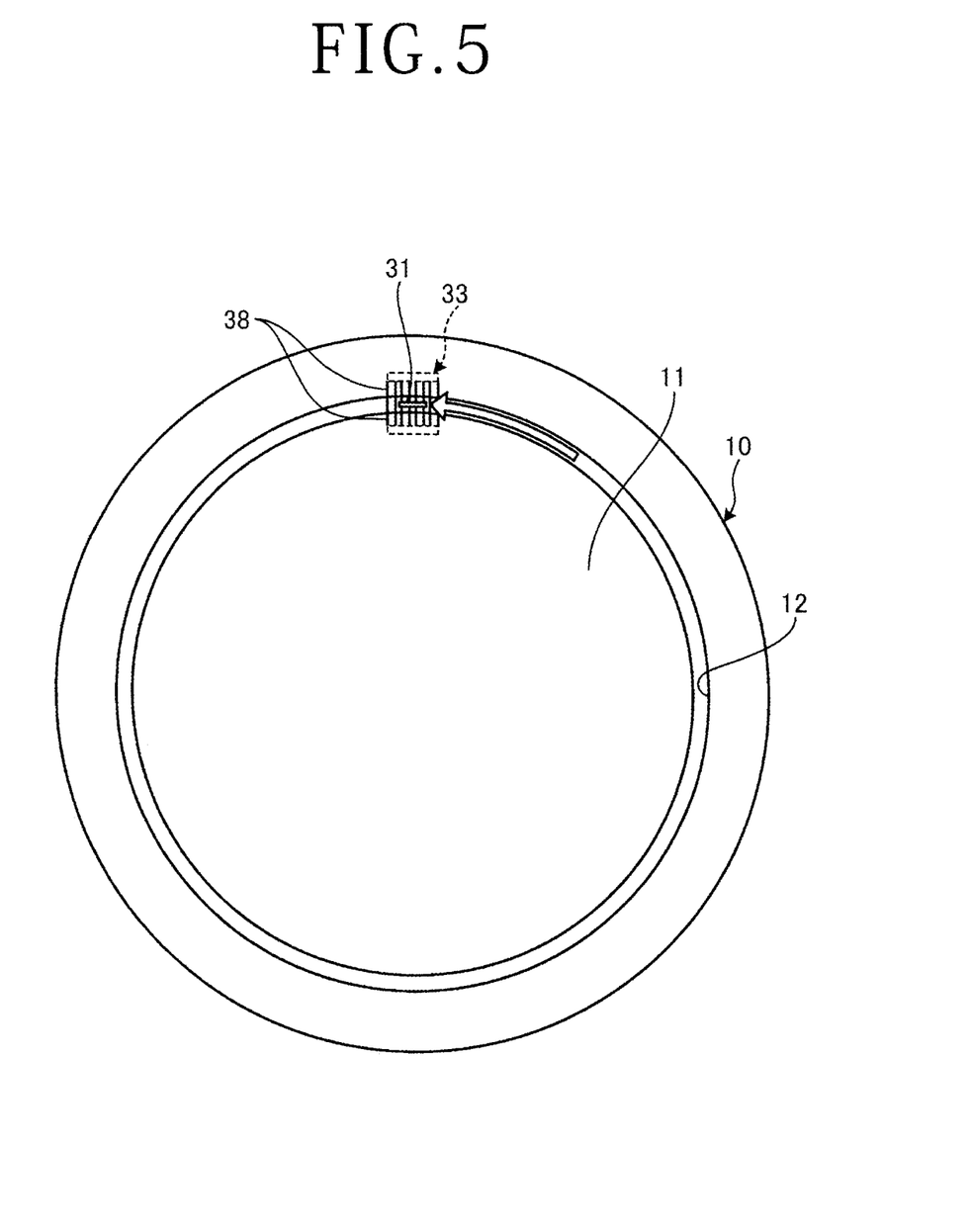
FIG. 5 is a top view illustrating a cleaning part depicted in FIG. 1.
Figure 6:
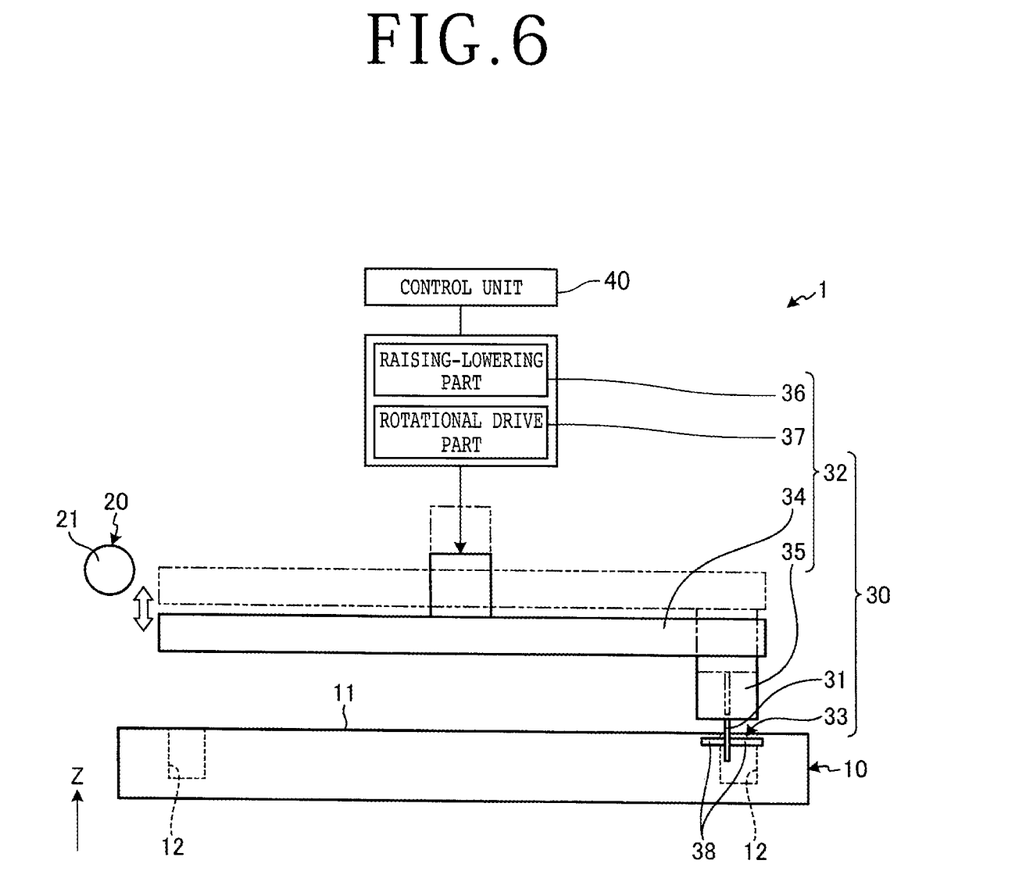
FIG. 6 is a sectional view illustrating the cleaning part depicted in FIG. 1.

A sheet sticking apparatus 1 according to a first embodiment of the present invention will be described in reference to drawings. FIG. 1 is a sectional view illustrating a configuration example of the sheet sticking apparatus 1 according to the first embodiment. FIG. 2 is a plan view illustrating a workpiece 100 that is a sheet sticking target of the sheet sticking apparatus 1 illustrated in FIG. 1. FIG. 3 is a sectional view for explaining a sticking unit 20 illustrated in FIG. 1. FIG. 4 is a sectional view for explaining a cutting unit 30 illustrated in FIG. 1. FIG. 5 is a top view illustrating a cleaning part 33 illustrated in FIG. 1. FIG. 6 is a sectional view for explaining the cleaning part 33 illustrated in FIG. 1. As illustrated in FIG. 1, the sheet sticking apparatus 1 includes a chuck table 10, the sticking unit 20, the cutting unit 30, and a control unit 40.

A workpiece 100 that is a sheet sticking target of the sheet sticking apparatus 1 according to the first embodiment, i.e., an adherend, is, for example, a circular plate-shaped semiconductor wafer or optical device wafer that contains silicon, sapphire, silicon carbide (SiC), or gallium arsenide as a base material. In the workpiece 100, as illustrated in FIG. 2, devices 103 are formed in regions marked out by multiple planned dividing lines 102 formed in a lattice manner in a front surface 101. The workpiece 100 is not limited thereto in the present invention and may be a rectangular resin package substrate having multiple devices sealed by resin, a glass substrate, a ceramic substrate, a glass plate, or the like.

A sheet 200 to be stuck to the workpiece 100 by the sheet sticking apparatus 1 according to the first embodiment is, for example, what is generally called an adhesive tape having a layer-stacking structure of a base layer made of resin and a glue layer formed of an adhesive made of resin. In the present embodiment, the sheet 200 protects the side of the front surface 101 of the workpiece 100 through being stuck with the glue layer side having adhesiveness oriented toward the side of the front surface 101 of the workpiece 100. The sheet 200 is not limited thereto in the present invention and may be stuck to the side of a back surface 104 on the side opposite to the front surface 101 instead of the side of the front surface 101 of the workpiece 100. A protective sheet with only the base layer and not the glue layer may be pressure-bonded to the workpiece 100 while being heated. Furthermore, the sheet 200 is not limited to what is generally called the adhesive tape in the present invention and may be what is generally called a thermoplastic resin sheet that is formed into a sheet shape by a thermoplastic resin being pushed and spread while being heated to be softened or melted and obtains adhesiveness by the heating.

The chuck table 10 includes a circular disc-shaped frame body in which a recessed part is formed and a suction adhesion part that is fitted into the recessed part and has a circular disc shape. The suction adhesion part of the chuck table 10 is formed from porous ceramic with a porous shape or the like and is connected to an unillustrated vacuum suction source through an unillustrated vacuum suction path. The upper surface of the suction adhesion part of the chuck table 10 is a holding surface 11 on which the workpiece 100 is placed and that holds under suction the placed workpiece 100. In the first embodiment, the workpiece 100 is placed on the holding surface 11 with the front surface 101 oriented upward, and the holding surface 11 holds under suction the placed workpiece 100 from the side of the back surface 104. The chuck table 10 is not limited to what is generally called the porous chuck table including the suction adhesion part formed from porous ceramic or the like in the present invention and may have a configuration in which suction holes are made in a region corresponding to the workpiece 100. The holding surface 11 and the upper surface of the frame body of the chuck table 10 are disposed on the same plane and are formed in parallel to the horizontal plane. In the chuck table 10, a circular annular groove 12 having a diameter similar to the outer circumferential diameter of the workpiece 100 is formed in the upper surface of the frame body. The groove 12 is formed on the trajectory of a cutting blade 31 that moves by a movement unit 32 of the cutting unit 30 to be described later and functions as a clearance groove of the cutting blade 31. In addition, the cleaning part 33 of the cutting unit 30 is disposed inside the groove 12.

In the first embodiment, the sticking unit 20 is disposed over the chuck table 10 and includes a roller 21 that moves in association with rotation while rotating around the axial center parallel to the horizontal direction. As illustrated in FIG. 3, in a state in which the cutting unit 30 has been sufficiently evacuated from the chuck table 10 to the upper side, the sticking unit 20 moves the roller 21 rotationally from one end, on the side of the front surface 101, of the workpiece 100 held by the chuck table 10 with the interposition of the sheet 200 toward the other end. As a result, while placing the sheet 200 sequentially from the one end of the workpiece 100 on the side of the front surface 101, the sticking unit 20 presses the placed sheet 200 against the workpiece 100 with a predetermined pressing force by the roller 21. Consequently, the sticking unit 20 sticks the sheet 200 to the front surface 101 of the workpiece 100 held by the chuck table 10. When the sheet 200 to be stuck to the workpiece 100 is a thermoplastic resin sheet, the sticking unit 20 heats the sheet 200 from the side of the roller 21 or the side of the chuck table 10 to soften it in addition to the rotational movement of the roller 21 and thereby stick the softened sheet 200 to the front surface 101 of the workpiece 100.

The sticking unit 20 is not limited to the form including the roller 21 in the present invention and may stick the sheet 200 through pressing the sheet 200 against the front surface 101 of the workpiece 100 by a pressing plate having a pressing surface with shape and area similar to those of the chuck table 10. Moreover, the sticking unit 20 may stick the sheet 200 to the front surface 101 of the workpiece 100 by blowing a wind. Furthermore, what is generally called a vacuum mounter may be used, and the sheet 200 may be stuck to the workpiece 100 by use of a difference of atmospheric pressure.

As illustrated in FIG. 4, the cutting unit 30 includes the cutting blade 31, the movement unit 32, and the cleaning part 33. The movement unit 32 includes a circular plate 34, a cutting blade support part 35, a raising-lowering part 36, and a rotational drive part 37. The circular plate 34 is disposed over the chuck table 10. The cutting blade support part 35 is disposed in a predetermined region in the circumferential direction on the lower side of the outer circumferential part of the circular plate 34 and supports the cutting blade 31 with the cutting edge side of the cutting blade 31 oriented toward the chuck table 10 on the lower side.

The raising-lowering part 36 is connected to the circular plate 34. By raising and lowering the circular plate 34, the raising-lowering part 36 raises and lowers the cutting blade support part 35 along the vertical direction (Z-axis direction in FIG. 4) to cause the cutting blade 31 to lower in such a direction as to get closer to the chuck table 10 and rise in such a direction as to get farther away from the chuck table 10. The raising-lowering part 36 outputs information regarding the height of the circular plate 34 to the control unit 40.

The rotational drive part 37 is connected to the circular plate 34. By driving the circular plate 34 rotationally around the axial center parallel to the vertical direction, the rotational drive part 37 moves the cutting blade support part 35 rotationally along the circumferential direction of the circular plate 34 and moves the cutting blade 31 rotationally along the circumferential direction of the circular plate 34. The rotational drive part 37 outputs information regarding the rotation angle of the circular plate 34 to the control unit 40.

As illustrated in FIG. 4, the cutting unit 30 causes the circular plate 34 and the cutting blade support part 35 to lower in such a direction as to get closer to the chuck table 10 by the raising-lowering part 36. As a result, the cutting unit 30 causes the cutting edge side of the cutting blade 31 to cut into the sheet 200 stuck to the side of the front surface 101 of the workpiece 100 held by the chuck table 10. Moreover, in the first embodiment, by rotating the circular plate 34 around the axial center by the rotational drive part 37 in a state in which the cutting blade 31 is slightly inserted in the groove 12, the cutting unit 30 moves the cutting blade 31 rotationally along the outer circumferential edge of the workpiece 100 and cuts off a protruding portion 201 of the sheet 200 that protrudes in the radial direction from the outer circumferential edge of the workpiece 100. In the first embodiment, the cutting unit 30 cuts the sheet 200 with the cutting edge of the cutting blade 31 positioned to such a height as to be slightly inserted in the groove 12. However, the configuration is not limited thereto in the present invention, and the sheet 200 may be cut with the cutting edge of the cutting blade 31 positioned to such a height as to be slightly raised from the groove 12. Moreover, in the first embodiment, the cutting unit 30 cuts the sheet 200 by the cutting blade 31 from the side of the sheet 200 stuck to the workpiece 100. However, the configuration is not limited thereto in the present invention, and the sheet 200 may be cut from the side of the workpiece 100.

The cutting unit 30 is equipped with an unillustrated cutting blade heating part that heats the cutting edge of the cutting blade 31. The cutting unit 30 heats and softens the sheet 200 through the cutting edge of the cutting blade 31 and facilitates cutting by heating the cutting edge of the cutting blade 31 by the cutting blade heating part. Hence, occurrence of a burr in the sheet 200 is suppressed, and the sheet 200 can be cut by the cutting blade 31 more accurately in conformity to the shape of the outer circumferential edge of the workpiece 100.

As illustrated in FIG. 5 and FIG. 6, the cleaning part 33 includes multiple cleaning components 38. In the first embodiment, the multiple cleaning components 38 are collectively disposed in a predetermined region in the circumferential direction in the groove 12 of the chuck table 10 as illustrated in FIG. 5. However, the configuration is not limited thereto in the present invention, and the multiple cleaning components 38 may be disposed in multiple regions in a divided manner or may be disposed evenly across the whole circumference. In each of the multiple cleaning components 38, a portion that cleans the cutting edge of the cutting blade 31 (cleaning portion) is disposed to be oriented toward the trajectory of the cutting edge of the cutting blade 31 in the groove 12 of the chuck table 10 and overlap with this trajectory. Part of the cleaning component 38 is disposed on the inner circumferential side of the trajectory of the cutting edge of the cutting blade 31 in such a manner that the cleaning portion that cleans the cutting edge extends toward the outer circumferential side, and the remaining part of the cleaning component 38 is disposed on the outer circumferential side of the trajectory of the cutting edge of the cutting blade 31 in such a manner that the cleaning portion extends toward the inner circumferential side.

In each of the cleaning components 38, the cleaning portion comes into contact with the side surface of the cutting edge of the cutting blade 31 on the inner circumferential side or the outer circumferential side. Accordingly, the cleaning portion is pressed against the side surface and the tip of the cutting edge of the cutting blade 31 while being deformed along the side surface of the cutting edge of the cutting blade 31. This causes the cleaning portion to remove adhering things that have adhered to the side surface and the tip of the cutting edge of the cutting blade 31 and clean the side surface and the tip of the cutting edge of the cutting blade 31. Hence, for the cleaning component 38, the force with which the cleaning portion is pressed against the cutting edge of the cutting blade 31 can be properly adjusted by adjustment of the amount (for example, length) of overlap with the trajectory of the cutting edge of the cutting blade 31 by the cleaning portion or a property (for example, elastic force) of deformation of the material that forms the cleaning portion. The adhering thing that adheres to the cutting edge of the cutting blade 31 is, for example, dust made of the resin of the sheet 200 that adheres to the cutting edge of the cutting blade 31 due to cutting of the sheet 200 by the cutting blade 31.

In the first embodiment, as illustrated in FIG. 5 and FIG. 6, the cleaning components 38 are scrapers or spatulas that are formed of an elastic component such as rubbery resin and clean the cutting edge of the cutting blade 31 through contact of a tip portion that is the cleaning portion therewith. In the first embodiment, multiple pairs (in the example illustrated in FIG. 5, eight pairs) of scrapers or spatulas that are the cleaning components 38 are disposed, and the cleaning portions are disposed opposed to each other in such a manner as to be oriented toward the trajectory of the cutting edge of the cutting blade 31. The cleaning components 38 are not limited thereto in the present invention and may be rotating rollers that are formed of an elastic component such as rubbery resin and clean the cutting edge of the cutting blade 31 through contact of an outer circumferential portion that is the cleaning portion therewith. Moreover, the cleaning components 38 may be brushes that clean the cutting edge of the cutting blade 31 through contact of a hair material portion that is the cleaning portion therewith. Furthermore, the cleaning components 38 may have a configuration of being pressed against the cutting edge of the cutting blade 31 and being able to be deformed along the cutting edge of the cutting blade 31 through being fixed to an elastic component such as rubbery resin.

The control unit 40 controls operation of various constituent elements of the sheet sticking apparatus 1 to cause the sheet sticking apparatus 1 to execute sticking processing of sticking the sheet 200 to the front surface 101 of the workpiece 100, cutting-off processing of cutting off the protruding portion 201 of the sheet 200, and cleaning processing of cleaning the cutting edge of the cutting blade 31. In the first embodiment, the control unit 40 includes a computer system. The computer system included in the control unit 40 has a calculation processing device having a microprocessor as exemplified by a central processing unit (CPU), a storing device having a memory as exemplified by a read only memory (ROM) or a random access memory (RAM), and an input-output interface device. The calculation processing device of the control unit 40 executes calculation processing in accordance with a computer program stored in the storing device of the control unit 40 and outputs a control signal for controlling the sheet sticking apparatus 1 to the respective constituent elements of the sheet sticking apparatus 1 through the input-output interface device of the control unit 40.

Next, the present specification will explain operation of the cleaning processing of the sheet sticking apparatus 1 according to the first embodiment with use of drawings. The sheet sticking apparatus 1 executes the cleaning processing after cutting the sheet 200 by the cutting blade 31 or before cutting the next sheet 200 by the cutting blade 31 or the like, for example.

In the cleaning processing, first, the control unit 40 of the sheet sticking apparatus 1 moves the cutting blade 31 rotationally along the circumferential direction of the circular plate 34 by controlling the rotational drive part 37 and rotating the circular plate 34 and, as illustrated in FIG. 5, adjusts the position of the cutting edge of the cutting blade 31 in the circumferential direction to a predetermined region in which the cleaning components 38 are disposed and toward which the cleaning portions of the cleaning components 38 are oriented. In the cleaning processing, next, as illustrated in FIG. 6, the control unit 40 repetitively raises and lowers the cutting blade 31 by controlling the raising-lowering part 36 and repetitively raising and lowering the circular plate 34, and causes the cutting edge of the cutting blade 31 to pass through the region toward which the cleaning portions of the cleaning components 38 are oriented in the rising direction and the lowering direction a predetermined number of times or more. As a result, every time the cutting edge of the cutting blade 31 passes through this region, the cleaning components 38 remove adhering things that have adhered to the cutting edge of the cutting blade 31 and clean the cutting edge of the cutting blade 31.

In the sheet sticking apparatus 1 according to the first embodiment having the above configuration, disposing the cleaning part 33 that removes adhering things of the cutting blade 31 on the trajectory along which the cutting blade 31 can move makes it possible to remove the adhering things of the cutting blade 31 without increasing an actuator, and also prevent lowering of the sharpness of the cutting blade 31. This provides such operation and effect that the possibility of occurrence of cutting failure can easily be reduced.

Further, in the sheet sticking apparatus 1 according to the first embodiment, the cleaning part 33 is configured by the cleaning components 38 that are pressed against the cutting edge of the cutting blade 31 and can be deformed, such as scrapers or brushes formed of an elastic component, or the cleaning part 33 is fixed to an elastic component. This provides such operation and effect that the cleaning part 33 can be brought into contact with the cutting blade 31 with a moderate force and cleaning can favorably be executed without use of an actuator.

Second Embodiment

Figure 7:
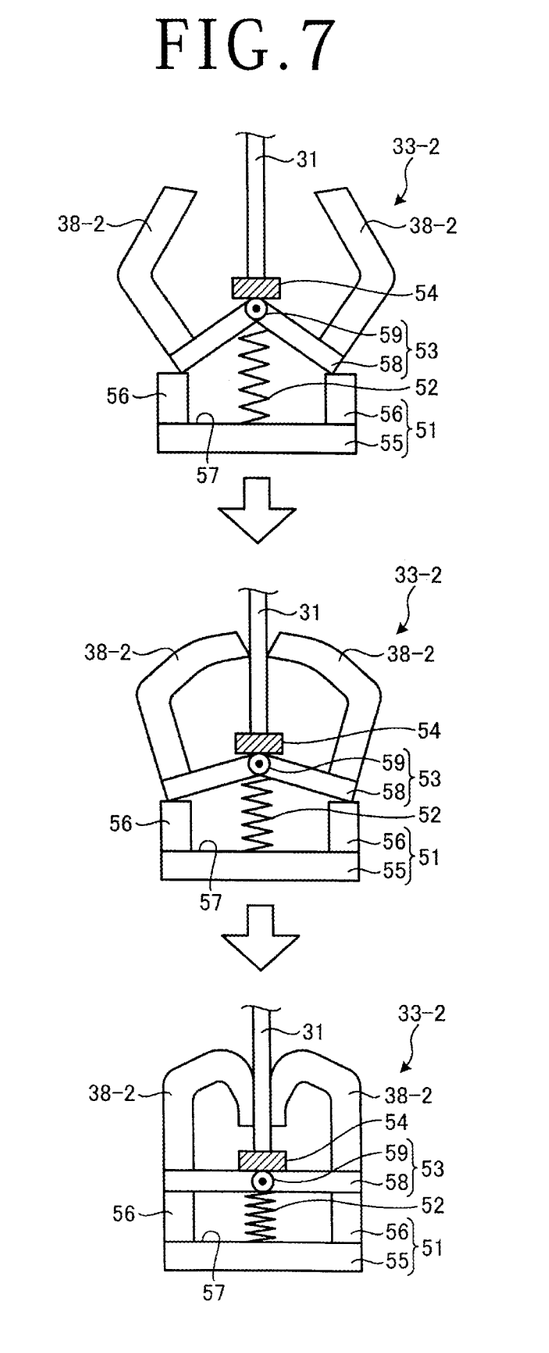
FIG. 7 is a sectional view illustrating a cleaning part of the sheet sticking apparatus according to a second embodiment of the present invention.

The sheet sticking apparatus 1 according to a second embodiment of the present invention will be described in reference to a drawing. FIG. 7 is a sectional view illustrating a cleaning part 33-2 of the sheet sticking apparatus 1 according to the second embodiment. In FIG. 7, the same part as the first embodiment is given the same numeral, and description thereof is omitted.

The sheet sticking apparatus 1 according to the second embodiment is what is obtained by changing the cleaning part 33 to the cleaning part 33-2 in the first embodiment, and the other configuration is the same as the first embodiment. The cleaning part 33-2 includes a pair of cleaning components 38-2, a groove component 51, a spring 52, a link mechanism 53, and an alleviating component 54 as illustrated in FIG. 7. The pair of cleaning components 38-2 are scrapers formed of an elastic component similar to that of the cleaning components 38 of the first embodiment. However, the cleaning components 38-2 are different from the cleaning components 38 of the first embodiment in that they are formed in a bending shape.

The groove component 51 is disposed in the groove 12 of the chuck table 10 and has a base 55 and a pair of sidewall parts 56 erected upward from the base 55 as illustrated in FIG. 7. The pair of sidewall parts 56 are disposed at an interval in the width direction of the groove 12, i.e., the radial direction of the chuck table 10, and the interval between them has a width that is wider than the thickness of the cutting edge of the cutting blade 31 but smaller than the groove 12. The pair of sidewall parts 56 form a groove 57 between them.

One end of the spring 52 is connected to the bottom surface of the groove 57, i.e., the upper surface of the base 55, and the other end is connected to a joint part 59 of the link mechanism 53. The link mechanism 53 has link parts 58 that are a pair of bar-shaped components and the joint part 59 that is a rotation axis component that connects one ends of the pair of link parts 58 to each other in such a manner that the link parts 58 can pivot around each other. The one end of each of the link parts 58 is connected to the joint part 59, and the other end is supported at a certain height from the lower side by the upper surface of the sidewall part 56 or the like. The joint part 59 is positioned on the trajectory of the cutting edge of the cutting blade 31 and is biased upward by the spring 52 in such a manner as to become higher than the other end side of the link parts 58 when a force is not applied thereto.

The cleaning component 38-2 is disposed upward at the other end of each of the link parts 58. In the pair of cleaning components 38-2 each disposed on the pair of link parts 58, tip portions (cleaning portions) that clean the cutting edge of the cutting blade 31 bend toward such directions as to face each other. In the pair of cleaning components 38-2, the cleaning portions are biased toward such directions as to get farther away from each other in association with the biasing of the joint part 59 toward the upper side by the spring 52. As described above, the link mechanism 53 biases the cleaning portions of the pair of cleaning components 38-2 in such directions that the cleaning portions get farther away from each other, and allows the cleaning portions of the pair of cleaning components 38-2 to move toward such directions as to get closer to each other against the biasing in association with lowering of the cutting edge of the cutting blade 31 by the raising-lowering part 36 and moving of the joint part 59 downward against the biasing by the cutting edge of the cutting blade 31.

The alleviating component 54 is disposed over the joint part 59 of the link mechanism 53 and alleviates a shock received from the cutting edge of the cutting blade 31 that is lowered by the raising-lowering part 36. It is preferable for the alleviating component 54 to be formed of a material that is not cut by the cutting edge of the cutting blade 31 and can flexibly be deformed by the cutting edge of the cutting blade 31 due to contact of the cutting edge of the cutting blade 31 from the upper side, for example, an elastic component similar to that of the cleaning components 38 and 38-2.

In the sheet sticking apparatus 1 according to the second embodiment, one cleaning part 33-2 may be disposed or multiple cleaning parts 33-2 may be disposed to be arranged in the extension direction of the groove 57 (circumferential direction of the chuck table).

Next, the present specification will explain operation of cleaning processing of the sheet sticking apparatus 1 according to the second embodiment with use of the drawing. In the cleaning processing, first, the control unit 40 of the sheet sticking apparatus 1 according to the second embodiment adjusts the position of the cutting edge of the cutting blade 31 in the circumferential direction to a predetermined region in which the cleaning components 38-2 are disposed as in the first embodiment. In the cleaning processing of the second embodiment, next, as illustrated in FIG. 7, the control unit 40 lowers the cutting edge of the cutting blade 31 by controlling the raising-lowering part 36 and lowering the circular plate 34, and moves the joint part 59 downward against the biasing by the cutting edge of the cutting blade 31 through the alleviating component 54. As a result, in the pair of cleaning components 38-2, the cleaning portions move toward such directions as to get closer to each other against the biasing, and the cleaning portions are each brought into contact with a respective one of the side surfaces of the cutting edge of the cutting blade 31 on the inner circumferential side and the outer circumferential side. Moreover, the cleaning portions are moved toward the tip side of the cutting edge of the cutting blade 31 while being pressed against the side surfaces of the cutting edge of the cutting blade 31 with a moderate force. Consequently, adhering things that have adhered to the cutting edge of the cutting blade 31 are removed, and the cutting edge of the cutting blade 31 is cleaned.

Further, in the cleaning processing of the second embodiment, the control unit 40 raises the cutting edge of the cutting blade 31 by controlling the raising-lowering part 36 and raising the circular plate 34, and cancels the downward force applied to the joint part 59 by the cutting edge of the cutting blade 31 through the alleviating component 54. As a result, the pair of cleaning components 38-2 move the cleaning portions pressed against the side surfaces of the cutting edge of the cutting blade 31 on the inner circumferential side and the outer circumferential side with the moderate force toward the base end side of the cutting edge of the cutting blade 31 while the force of the pressing is gradually cancelled. Consequently, after removing the adhering things that have adhered to the cutting edge of the cutting blade 31 and cleaning the cutting edge of the cutting blade 31, the cleaning portions are each separated from the respective one of the side surfaces of the cutting edge of the cutting blade 31 on the inner circumferential side and the outer circumferential side and release the cutting edge of the cutting blade 31.

The sheet sticking apparatus 1 according to the second embodiment having the above configuration is what is obtained by changing the cleaning part 33 to the cleaning part 33-2 in the first embodiment and thus provides operation and effects similar to those of the first embodiment. Moreover, the sheet sticking apparatus 1 according to the second embodiment removes adhering things that have adhered to the cutting edge of the cutting blade 31 by moving the cleaning portions of the cleaning components 38-2 toward the tip side of the cutting edge of the cutting blade 31 while pressing the cleaning portions against the side surfaces of the cutting edge of the cutting blade 31 on the inner circumferential side and the outer circumferential side with a moderate force. Thus, the sheet sticking apparatus 1 according to the second embodiment provides such operation and effect that the adhering things can be removed more reliably and scratching of the cleaning portions of the cleaning components 38-2 by the cutting edge of the cutting blade 31 can be reduced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A sheet sticking apparatus comprising:
    a sticking unit that sticks a sheet to a workpiece held by a chuck table; and
    a cutting unit that cuts the stuck sheet,
    wherein the cutting unit includes:
        a cutting blade that cuts the sheet,
        a movement unit that raises and lowers the cutting blade from and toward the chuck table or moves the cutting blade along an outer circumference of the workpiece, and
        a cleaning part that removes adhering things from the cutting blade, and
        wherein the cleaning part is disposed in the chuck table on a trajectory of the cutting blade that moves by the movement unit and executes cleaning by coming into contact with the cutting blade that moves.

2. The sheet sticking apparatus according to claim 1, wherein the cleaning part brings a scraper into contact with the cutting blade.

3. The sheet sticking apparatus according to claim 1, wherein the cleaning part brings a brush into contact with the cutting blade.

4. The sheet sticking apparatus according to claim 1, wherein:
    the chuck table includes a groove that is formed along the trajectory of the cutting blade; and
    the cleaning part includes at least one cleaning component that extends into the groove, and is configured and arranged to make contact with the cutting blade.

5. The sheet sticking apparatus according to claim 4, wherein the cleaning component comprises at least one pair of elastomeric scrapers.

6. The sheet sticking apparatus according to claim 4, wherein the cleaning component comprises a plurality of pairs of elastomeric scrapers.

7. The sheet sticking apparatus according to claim 4, wherein the cleaning component comprises at least one pair of rotating rollers.

8. The sheet sticking apparatus according to claim 4, wherein the cleaning component comprises a plurality of brushes.

9. The sheet sticking apparatus according to claim 4, wherein the cleaning component is fixed to an elastic component such that the cleaning component is capable of being deformed by contact with the cutting blade.

10. The sheet sticking apparatus according to claim 1, wherein:
    the chuck table includes a groove that is formed along the trajectory of the cutting blade; and
    the cleaning part includes a groove component seated within the groove, a spring seated within the groove component, a link mechanism including a joint part that is biased by the spring, and a pair of cleaning components that connected to the link mechanism, wherein the cleaning components are configured and arranged to make contact with the cutting blade when the cutting blade is lowered towards the cleaning part.

* * * * *